United States Patent [19]

O'Connor

[11] 4,400,712

[45] Aug. 23, 1983

[54] STATIC BIPOLAR RANDOM ACCESS MEMORY

[75] Inventor: Kevin J. O'Connor, Center Valley, Pa.

[73] Assignee: Bell Telephone Laboratories, Incorporated, Murray Hill, N.J.

[21] Appl. No.: 234,453

[22] Filed: Feb. 13, 1981

[51] Int. Cl.³ .................... H01L 27/10; G11C 11/40
[52] U.S. Cl. ....................................... 357/44; 357/15; 357/46; 357/50; 357/92; 365/156; 365/181
[58] Field of Search .................. 365/156, 181; 357/92, 357/44, 46, 15, 50

[56] References Cited

U.S. PATENT DOCUMENTS

| 3,643,235 | 2/1972 | Berger et al. | 357/92 |
|---|---|---|---|
| 3,909,807 | 9/1975 | Fulton | 340/173 |
| 4,021,786 | 5/1977 | Peterson | 357/92 |
| 4,104,732 | 8/1978 | Hewlett, Jr. | 357/92 |
| 4,144,098 | 3/1979 | Roesner | 357/92 |
| 4,144,586 | 3/1979 | U | 357/92 |
| 4,221,977 | 9/1980 | Parkinson | 357/92 |

OTHER PUBLICATIONS

Agraz-Guerena et al., 1978 IEEE International Electron Device Meeting, Technical Digest pp. 209-212 (Dec. 3, 1978).
IEEE Journal of Solid State Circuits, vol. SC-4, No. 5, Oct. 1969, pp. 280-284.
IEEE Journal of Solid State Circuits, vol. SC-5, No. 5, Oct. 1970, pp. 186-191.
IEEE Journal of Solid State Circuits, vol. SC-6, No. 5, Oct. 1971, pp. 283-288.
IEEE Journal of Solid State Circuits, vol. SC-8, No. 5, Oct. 1973, pp. 332-337.
IEEE Trans. on Electron Devices, vol. ED-27, No. 8, Aug. 1980, pp. 1397-1401.
1980 Digest of Technical Papers—IEEE International Solid-State Circuits Conference, pp. 222-223.

*Primary Examiner*—William D. Larkins
*Attorney, Agent, or Firm*—Arthur J. Torsiglieri

[57] ABSTRACT

A static bipolar random access memory employs a novel layout for high packing density. Each cell uses a cross-coupled pair of NPN vertical transistors as drivers merged with a pair of PNP lateral transistors as loads, Schottky diode coupling to the input/output lines and Schottky diode clamping of the internal nodes. The PNP transistors are also partially merged between cells to conserve space. OXIL technology is used to achieve high gain vertical transistors and to provide dielectric isolation.

1 Claim, 11 Drawing Figures

4,400,712

STATIC BIPOLAR RANDOM ACCESS MEMORY

TECHNICAL FIELD

This invention relates to static bipolar random access memories and more particularly to a memory cell useful in such memories.

BACKGROUND OF THE INVENTION

Static bipolar random access memories are well known for use in applications where important considerations are short access times for reading and writing, low vulnerability to alpha particle errors, and less volatility than is characteristic of dynamic random access memories.

The usual cell for use in static RAMs typically includes a bistable circuit including a pair of cross-coupled transistors and a pair of load transistors, and a pair of diodes or transistors for coupling the internal nodes of the bistable circuit to the input/output bit lines. Among the variety of cells of this kind proposed there is one which employs NPN transistors as the cross-coupled pair, PNP transistors as the load pair, and PNP transistors as the coupling pair. To decrease the cell size and keep the power dissipation low, there is extensive merging of the devices in a combined circuit layout design and there is used the principle of direct minority carrier injection both for the current supply and for coupling to the input/output lines. To this end the cross-coupled PNP transistors are designed as upside-down operated or inverse transistors with a common N plane acting as an emitter. It is usually difficult to achieve high gain in inverse transistors by the usual fabrication techniques, and in these prior art devices the low gain necessitates compromises in the design and makes for instability in the bistable circuit.

It has previously been recognized that Schottky diodes are useful for the coupling elements because of their low capacitance, negligible storage time and small size. However, their lack of gain is a deterrent to their use since gain is useful for increasing the stability of the bistable circuit. It has also been proposed that it would be preferable to drive the readout lines by a constant current source rather than a constant voltage source if it were convenient to do so.

Among the bipolar technologies which have been proposed for the effective implementation of merger or injection coupled logic is the so-called OXIL technology described in the *IEEE Trans. on Electron Devices*, Vol. ED-27, No. 8, August 1980, pp 1397–1401. This technology can provide vertical upside-down transistors for injection coupled logic which operate in the forward mode with consequent high gain.

SUMMARY OF THE INVENTION

In accordance with the invention the various characteristics mentioned above as desirable have been achieved by combination of a novel layout for the cell combined with the technology for providing high gain vertical upside-down transistors. This combination of layout design and technology permits a static memory cell in which the bistable circuit comprises a pair of high gain vertical NPN transistors and a pair of complementary PNP load transistors and in which the internal nodes are coupled to the input/output bit lines by way of Schottky diodes. Additionally, advantageously the internal nodes are coupled together by a parallel arrangement of a pair of oppositely-poled clamping Schottky diodes and all the diodes are integrated with the transistors.

In the layout, each driver transistor of a cell is diagonally oriented in the chip with respect to the other driver transistor to facilitate interconnection and portions of the PNP load transistors are merged between cells to conserve space.

DETAILED DESCRIPTION

Figure 1:
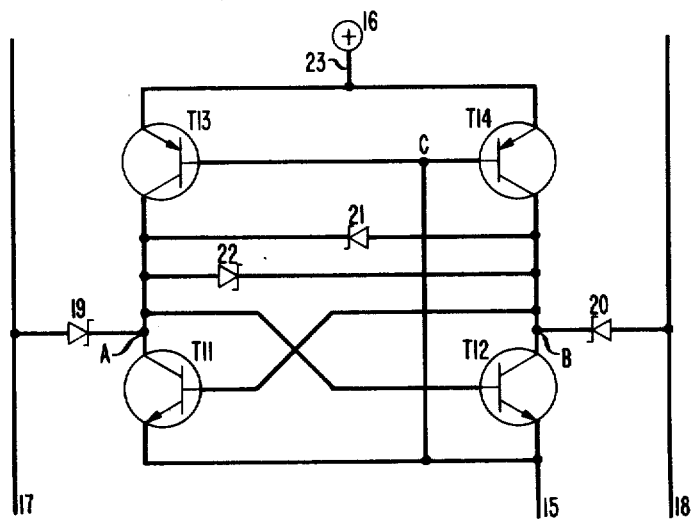
FIG. 1 is a circuit schematic of a cell forming the preferred embodiment of the invention.

With reference now to the drawing, the memory cell 10, shown in FIG. 1, comprises the pair of cross-coupled NPN junction transistors T11 and T12 having gain and the pair of PNP load transistors T13 and T14. In particular, the base of transistor T11 is connected to the collectors of transistors T12 and T14 to form internal node B of the cell and the base of transistor T12 is connected to the collectors of transistors T11 and T13 to form internal node A of the cell. The emitters of transistors T11 and T12 are each tied to the lower word line 15 as are the bases of transistors T13 and T14. The emitters of transistors T13 and T14 are each tied to a current source 16 supplying the upper word line 23. Bit lines 17 and 18 are connected to nodes A and B by way of Schottky barrier diodes 19 and 20, respectively. Nodes A and B are also clamped together by the parallel arrangement of oppositely-poled Schottky diodes 21 and 22.

The basic operation of the cell is straightforward and is essentially the same as prior art forms.

To prepare a chosen cell for reading or writing the appropriate writing or reading voltage is established on the lower word line 15. For writing, a voltage difference is simultaneously established between the two bit lines 17 and 18 by signal information to be stored, and this difference is coupled by way of the diodes 19 and 20 to internal nodes A and B, and the bistable circuit is set to the corresponding one of its two states. This state will be maintained even after the bit line voltage difference is removed so long as a minimum sustaining current is provided by the current source 16 even after the voltage on lower word line 15 is restored to a sustaining value.

For reading, after applying balancing voltages to the bit lines and establishing the appropriate reading voltage on the lower word line 15, a current flows in the coupling diode connected to the On NPN transistor which can be detected by a sense amplifier (not shown) in usual fashion to provide the desired output.

The use of Schottky diodes for coupling to the bit lines offers the advantage of increased writing speed and shorter cycle times than would the use of either PN junction diodes or coupling transistors, which are possible alternatives. Also as will be apparent from the description of the fabrication, such Schottky diodes are amenable to easy processing and permit a compact layout.

Moreover, by the inclusion of identical oppositely-poled diodes 21 and 22 connected between nodes A and B, the voltage difference between these nodes can be maintained precisely at the voltage drop associated with the diode. By the appropriate design of the Schottky diodes, whose barrier height may be controlled by a thin implanted surface region underlying the contact in known fashion, a desired low value of voltage difference may be maintained.

Usually when reading or writing, it was thought important to increase greatly the voltage provided between the upper and lower word lines to compensate for the increased current which flowed during the reading or writing operations which typically, at least for reading, was about ten times the static current. Such increases in current tend to increase the time it takes to deselect a line after the reading or writing is complete and so to lengthen the cycle time.

In my preferred embodiment, I lessen this problem by biasing the cells with a constant current source rather than a constant voltage source; and in particular in this embodiment, I use a common current source for all the cells in a common row since the high resistive values of the PNP load transistors make them serve as constant current sources for the individual cells. With a constant current source supplying individual cells, the balance at the internal nodes desirable before writing signals are applied is also readily achieved.

For a cell of the kind described, adequate gain for the drive transistors assures stability during the reading operation even when hard driving is used to compensate for marginal operating conditions.

Important other features of the invention reside in the manner in which the cell is laid out in the chip and in the manner in which it is fabricated.

Figure 2:
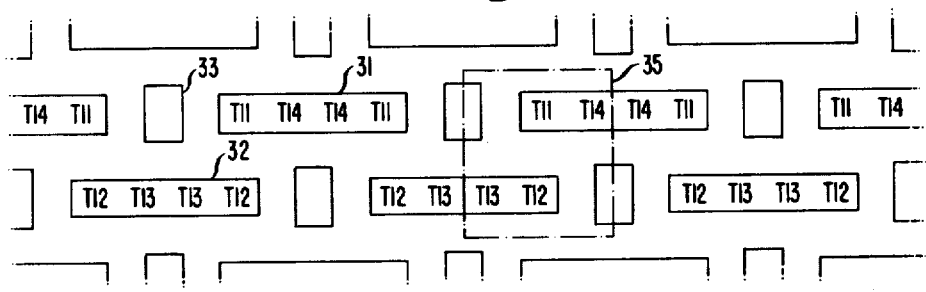
FIG. 2 is a top view depicting how cells are laid out to form a memory array in the semiconductive chip.

It will be helpful first to discuss the general layout of the memory cells in the chip and this can be appreciated from FIG. 2 which is a top view of a portion of one row of cells in the chip showing the relative positions of the two driver transistors T11 and T12 and the two load transistors T13 and T14 of each cell, such as one enclosed within the broken line 35.

It can be seen that the transistors T11 and T14 are included within the upper elongated blocks 31, and the transistors T12 and T13 the lower blocks 32, and the blocks are displaced from one another by a half cell period to optimize packing and, as will be discussed later, to facilitate interconnection. The more nearly square blocks 33 correspond to regions where electrodes will be provided to power the memory as will be discussed in more detail later. The regions included within blocks 31, 32, and 33 will be surrounded by trenches filled with silicon oxide to provide the necessary dielectric isolation.

Because the layout results in locating transistors T13 and T14 proximate to the corresponding transistors in its two neighboring cells in the same row, it is possible for portions of transistors T13 and T14 to be shared by neighboring cells to conserve space.

Figure 3:
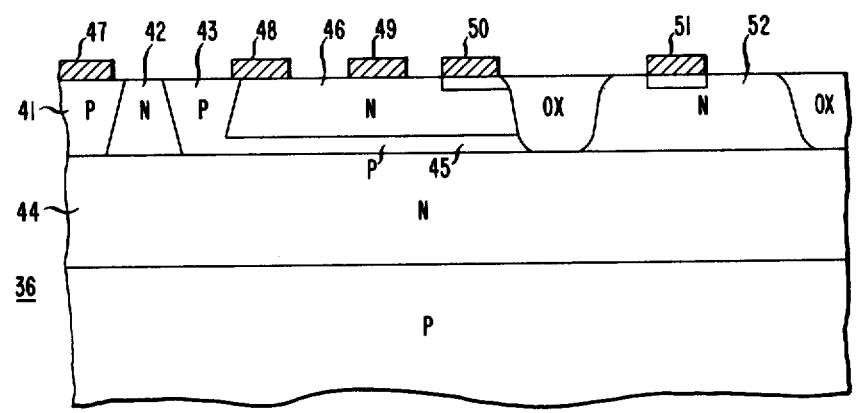
FIG. 3 shows a cross section of the semiconductive chip showing the structure of half of a cell.

FIG. 3 shows a cross section of one-half 36 of the cell 35. The cell would also include a similar half reversed. With reference also to FIGS. 1 and 2, it may be viewed as the half including a lateral load transistor T13 and the vertical driver transistor T12 included within line 35. The lateral transistor T13 includes the P-type emitter 41, the N-type base 42 and P-type collector 43 and the vertical transistor T18 includes the N-type emitter 44, the P-type graded base 45 and the N-type collector 46.

Electrode 47 makes ohmic connection to the emitter 41 of the load transistor T13 and is used to form a low resistance connection to the upper word line 23 which connects to the constant current source 16, as seen in FIG. 1.

Electrode 48 makes ohmic connection to P-type zone 43 which serves as the collector of the load transistor T13 and also makes a Schottky or rectifying connection to the N-type region 46 which is the collector of the drive transistor T12 and this electrode is used to make connection by way of a conductive runner to an electrode which makes ohmic connection to the collector of its driver transistor T11 in the other half of the cell. Accordingly, it effectively provides Schottky barrier diode 22 of the circuit shown in FIG. 1.

Electrode 49 makes a Schottky or rectifying connection to the N-type zone 46, the collector of the driver T12, and is used to make a low resistance connection to the bit line 18. It effectively provides the coupling Schottky diode 20.

Electrode 50 makes ohmic connection to a heavily doped layer on the N-type zone 46, the collector of transistor T12, and it is used to make connection to the runner which makes connection to the electrode in the other half of the cell corresponding to electrode 48, i.e., the electrode which makes low resistance connection to the P-type collector of the load transistor T14 and Schottky barrier connection to the N-type collector of the transistor T11.

Electrode 51 makes low resistance connection to a heavily doped layer on the N-type region 52 which essentially provides a low resistance connection to the emitter 44 of the driver transistor T12. This electrode is used to make low resistance connection to the lower word line 15 in the circuit of FIG. 1.

It can also be seen that the P-type region 43, the collector of the load transistor T13 internally makes a low resistance connection to P-type region 45, the base of the driver transistor T12. Moreover, the emitters of driver transistors T11 and T12 will share internally the N-type zone 44.

Moreover, as can be deduced from FIG. 2, the P-type emitter zone 41 can be used similarly as the emitter of the lateral transistor in the next-left cell and the N-type region 52 in the right-next cell in similar roles since each is connected directly to corresponding elements of all the cells in that row. Similarly, in the half cell portion, not shown, the emitter of transistor T14 is shared.

Figure 11:
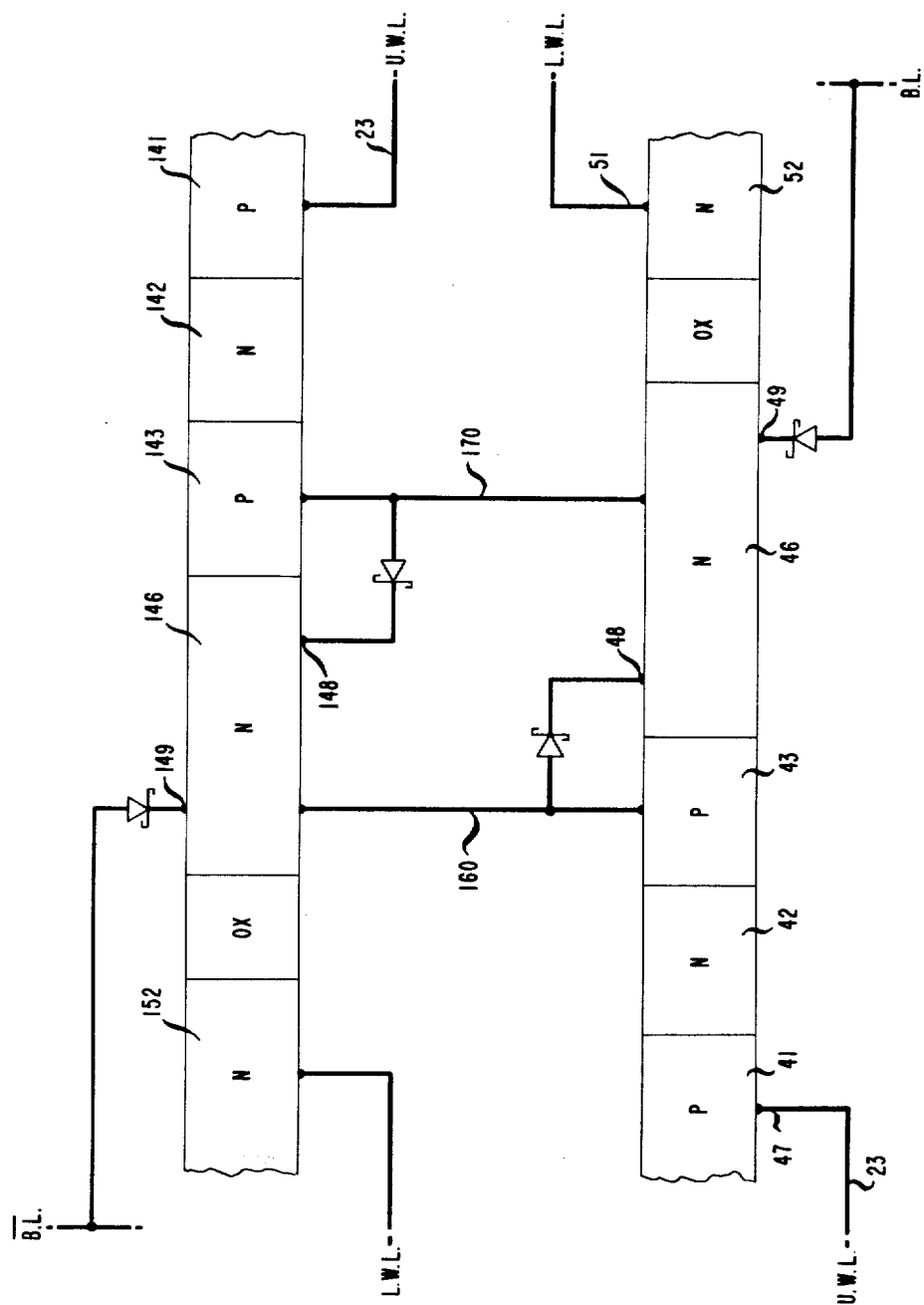
FIG. 11 is a partially schematic top view illustrating the two surface portions forming a single cell.

FIG. 11 provides a top view of the two separate surface portions of each cell, each portion corresponding to the single portion shown in cross section in FIG. 3, but the two portions being oppositely oriented, as indicated in FIG. 2. The regions of the upper surface portion, which is the one reversed with respect to FIG. 2, are represented by reference numerals one hundred larger than the corresponding region of the lower surface portion. Conductor 160 makes a direct electrical connection between region 43 and region 146, and conductor 170 makes a direct electrical connection between region 46 and region 143. Upper word line U.W.L. conductor makes direct electrical connection to regions 41 and 141. Lower word line L.W.L. makes direct electrical connection to regions 52 and 152. Bit line B.L. makes a Schottky connection by way of electrode 49 to region 46, and the bit line $\overline{B.L.}$ makes a Schottky connection to region 146 by way of electrode 149. Region 43 has a Schottky connection to region 46 by way of electrode 48 and region 143 has a Schottky connection to region 146 by way of electrode 148.

The following process was found to be especially advantageous to achieve the desired cell compactly and to provide the desired graded base for transistor T12. The process will be described usually with reference to the fabrication only of a single cell; and for the sake of simplicity, the drawing will illustrate the fabrication only of the single half cell 36 shown in FIG. 3. The processing is essentially of the kind described in the previously identified OXIL technology paper and reference is made thereto for details. It will, of course, be recognized that normally a large array of cells will be provided on each chip together with auxiliary circuitry, and that a large number of chips will be cut out of a single wafer and that the processing is largely done at the wafer level.

I begin with a monocrystalline wafer of silicon in which many chips are to be formed and in which each chip has a portion wherein an array of cells of the kind described is to be formed. The portion of the chip where the cells are to be formed is initially uniformly of P-type.

Next, the portions of the chip in which individual rows of cells are to be formed are implanted with donor impurities to form a corresponding number of heavily doped N-type strips, each of which runs essentially the length of the row of cells. These correspond to region 44 in FIG. 3. Each strip has a width sufficient to accommodate the four transistors of each cell. A suitable width is shown in FIG. 2 as the separation between the horizontal portions of the line 35. There needs to be maintained some separation between adjacent strips.

Figure 4:
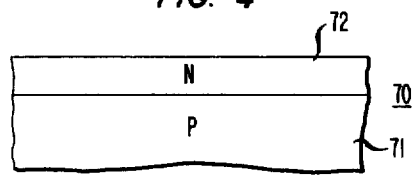
FIGS. 4 through 10 are either top views or cross sections at various stages in the fabrication of the cell shown in FIG. 3 useful in describing an illustrative process for making a cell in accordance with the invention. It should be noted that the figures are not drawn to scale.

The implanation in this instance, as in all other instances in the process, is typically done in known fashion. Typically, this involves forming on the silicon substrate a mask, typically of a photoresist suitably patterned by photolithographic techniques to have openings where implantation is desired and thereafter irradiating the substrate with a uniform beam of the desired ions, the ions penetrating the substrate essentially only where the substrate is exposed via the openings in the mask. In FIG. 4, there is shown in cross section a relevant portion of the wafer 70 including the original P-type portion 71 and the N-type implanted region 72.

Then selected area of these N strips are masked corresponding primarily to regions where the lateral PNP transistors ultimately are to be formed and where the connection to the buried N regions are to be made by way of the surface, and the remainder of the chip is implanted with acceptor ions to a depth and concentration adequate for the subsequent upward diffusion to be discussed below. This implantation is used to define the P-type region 45 shown in FIG. 3, the graded base region of the driver transistor.

Figure 5:
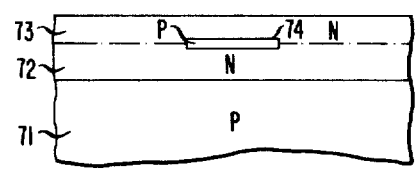

Next, in known fashion, an epitaxial layer is grown over the chip, the layer being grown to be lightly N-type and to have a thickness typically of about 2 microns. During the growth of this layer, involving maintaining the substrate at an elevated temperature, the previously implanted acceptor ions which have a higher mobility than the implanted donor ions will diffuse out of the substrate and form lightly doped P-type regions in the overlying regions of the epitaxial layer. In FIG. 5, there is shown the epitaxial N-type layer 73 and the diffused P-type layer 74. Moreover, in such P-type regions, the acceptor concentration will decrease with increasing distance from the N-type substrate, resulting in a desirable impurity gradient in such region for its role as the graded base of the vertical NPN transistor of which the N-type substrate provides the emitter and the overlying undiffused N- portion of the epitaxial layer provides the collector. Such a graded base permits high gain to be achieved in the driver transistor.

Figure 6:
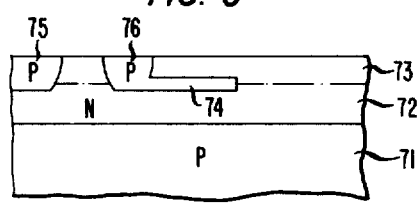

Then there is used another acceptor ion implant, advantageously boron, localized to form the P-type emitter and collector regions of the lateral PNP load transistors shown as regions 75 and 76 in FIG. 6. Region 76 is located so that it will intersect the diffused zone 74 and provide an effective low resistance connection thereto internally.

There next is introduced the dielectric isolation discussed earlier with reference to FIG. 2, both for isolating cells from one another and for isolating different parts of a cell to the extent desired. To this end grooves are formed in the chip substantially of the pattern to conform to the boundaries of blocks 31, 32, and 33 shown in FIG. 2. These grooves are deep enough that, after formation of the oxide filling the penetration extends essentially to the original N-type region 72. This can be done in the usual fashion utilizing a silicon nitride mask appropriately patterned.

After formation of the grooves, the chip is subjected to an oxidation treatment to fill the grooves with silicon oxide. Advantageously the oxidation is done in known fashion with a high pressure low temperature process to minimize the further movement of the significant impurities previously introduced, and so the effect on the desired impurity distributions in the chip. Additionally, oxide is deposited over the entire active surface of the chip to provide a dielectric barrier over which conductors can be deposited to provide selective connection to the chip and the necessary surface interconnections.

Figure 7:
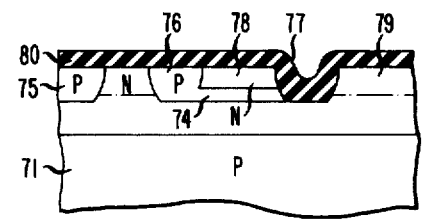

The result is shown in FIG. 7. As seen the oxide-filled groove 77 serves to isolate N-type region 78, which will serve as the collector of the driver or vertical NPN transistor, from the remaining N-type portion 79, which will serve to provide a low resistance connection to the N-type emitter of this same NPN transistor and an oxide layer 80 extends over the surface of the chip.

There now remains the need to provide the various contacts needed to the various elements of the cell including the formation of Schottky barrier contacts to introduce the Schottky diodes into the cell circuit and to provide the necessary interconnections to such contacts.

Figure 8:
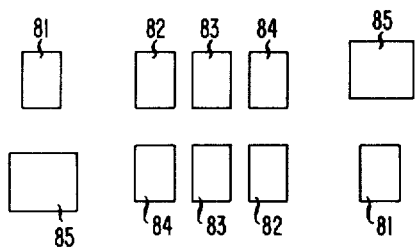

In FIG. 8, there is shown a top view of the pattern openings which are made in the silicon oxide layer overlying the active surface of the cell. In this figure there are shown the openings needed for both halves of the cell. The five openings shown in the top row are to expose portions of the half of the cell shown in FIG. 7 to add the contacts shown in FIG. 3 and the five openings in the bottom row are to expose portions of the other half of the cell not seen in FIG. 7.

With reference also to FIG. 3, the pair of openings 81 are to accommodate the low resistance contact 47 to the P-type region 41 and its counterpart in the other half cell; openings 82 to accommodate the hybrid contact 48 which makes low resistance connection to P-type zone 43 and a rectifying connection to N-type zone 46 and their counterparts; openings 83 to accommodate contacts 49 which makes rectifying connection to N-type zone 46 and its counterpart; openings 84 to accommodate contacts 50 which make a low resistance connection to N-type zone 56 and its counterpart; and openings 85 to accommodate contacts 51 to N-type region 53 and its counterpart.

It is important to increase the donor concentration at those lightly doped N-type surfaces where a low resistance connection rather than a rectifying connection is sought, so that the same metallization, platinum silicide, may be used to form the various contacts. As is known platinum silicide forms a low resistance connection to P-type and heavily doped N-type materials but a rectifying Schottky barrier connection to lightly doped N-type material such as is characteristic of the N-type epitaxial layer as initially grown.

This localized doping is readily achieved by first forming only openings 84 and 85 and implanting a heavy dose of donor ions through such openings to reduce the resistivity of the N-type surface sufficiently before forming the remaining openings. In addition, to control the barrier height of the Schottky diodes used to clamp the two internal nodes of the cell, it generally is desirable to lightly implant with donor ions the surface wherecontact 49 makes connection to N-type region 56. Since this light implant will not materially affect the P-type material, the remaining openings may all be formed and the whole surface treated to the light implant.

After the formation of the openings and the necessary implants, the active surface is covered with a thin layer of platinum which is then heated to sinter together the platinum and the silicon where the two are in contact. Any unsintered platinum can be readily removed. Techniques of this kind are well known so they need not be described in detail.

There remains to provide the metallization interconnecting the various contacts appropriately. This can be done in a variety of ways. Advantageously, this was done as follows.

A layer of titanium was first deposited over the oxide-covered active surface to provide a layer which adheres well to the apertured silicon oxide coating. This is further covered with a platinum layer.

Figure 9:
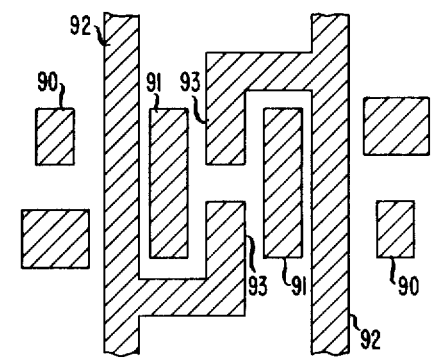

This dual layer is then patterned using a nickel mask in the usual fashion to remove unwanted metal, leaving a pattern of the kind shown in FIG. 9. This pattern includes a pair of pads 90 covering openings 81 for forming contacts 47, the short runners 91 which form contacts 48 and 50 and externally interconnect separately contacts 48 of one-half cell with contacts 50 of the other half cell not seen in FIG. 3, and the longer runners 93 are the two bit lines for all the cells in a common column. Each of these lines includes a tab portion 93 which makes a separate connection through the appropriate one of the openings 83 to the underlying Schottky contact 49.

Then there is deposited over the active surface a dielectric layer to provide electrical isolation beween this first level of metallization and the word lines which are formed from a second level of metallization. Advantageously, this insulation can be provided by a dual layer of deposited silicon oxide and silicon nitride.

Figure 10:
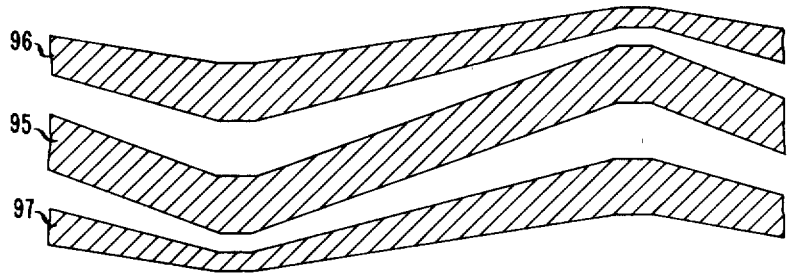

This dielectric layer needs to be opened to permit electrical connection separately to the contacts 47 and 51 by the upper and lower word lines respectively. To minimize the need for crossover of these two lines, it is found advantageous to split the upper word line into two halves, as seen in FIG. 10. The middle conductor 95 which corresponds to the lower word line 15 interconnects continuously the contacts 51 of all the cells in a given row. The upper conductor 96 interconnects all the contacts 47 in the lower row of openings as seen in FIG. 8 and the lower conductor 97 interconnects all the contacts 47 in the upper row of openings. At their ends, the two conductors are connected together so that they effectively serve as a single line. As previously indicated this avoids the need for crossing the upper word line and the lower word line conductors.

With a design of the kind described, I was able to build a 4 K static memory with access and cycle times of 25—35 nanoseconds and 350 milliwatt dissipation. The cell area was about 2.3 square mils; and $4 \times 1024$ organization was realized in a chip of about 23 thousand square mils with 3 micron design rules. By finer design rules even smaller and faster arrays can be made.

It can be appreciated that various changes should be possible in the specific embodiment described without departing from the spirit thereof. For example, the clamping diodes connected between the internal nodes were added to speed the discharge of high collector nodes but they may be omitted if this is deemed unnecessary. Similarly, it may be deemed preferable in some instances to avoid the use of Schottky diode coupling. Additionally, it should be feasible to utilize a different form of processing to achieve the structure desired.

What is claimed is:

1. A semiconductive device comprising a semiconductive chip including an array of memory cells, each memory cell being a bistable circuit including first and second cross-coupled driver junction transistors and first and second load driver junction transistors, each cell portion of the chip comprising a substrate portion of one conductivity type, a pair of surface portions separated from one another by a dielectric trench and overlying said bulk portion, each of said surface portions including an emitter region, a base region and a collector region for forming a lateral transistor, and a buried base region and a collector region for forming with an emitter region in the substrate portion a vertical transistor, the collector region of the lateral transistor merging with the buried base region of the verical transistor and the base region of the lateral transistor merging with the substrate emitter region of the vertical transistor, each surface portion further including a first electrode making low resistance connection to the emitter region of the lateral transistor, a second electrode making low resistance connection to the collector region of the lateral transistor and a Schottky connection to the collector region of the vertical transistor, a third electrode making Schottky connection to the collector region of the verical transistor, and a fourth electrode making low resistance connection to the collector of the vertical transistor, the first electrodes of each of the two surface portions being adapted to be connected to a common current source, the second electrode of each of the two surface portion being separately connected to the fourth electrode of the other surface region, and the third electrode of each surface region being connected separately to a different one of two bit lines, the base of the lateral transistor and the emitter and collector of the vertical transistor being of the same conductivity type as the substrate portion and the emitter and collector of the lateral transistor and the base of the vertical transistor being of the opposite conductivity, the buried base region of the vertical transistor terminates in the wall of the dielectric trench without reaching the surface except where the base region merges with the collector of the lateral transistor, and the first and second surface portions are oppositely oriented so that the lateral transistor in each surface portion is proximate the vertical transistor of the other surface portion.

* * * * *